United States Patent
Hata et al.

(10) Patent No.: US 10,340,375 B2
(45) Date of Patent: Jul. 2, 2019

(54) EPITAXIAL SUBSTRATE FOR FIELD EFFECT TRANSISTOR

(75) Inventors: Masahiko Hata, Tsuchiura (JP);
Hiroyuki Sazawa, Tsukuba (JP);
Naohiro Nishikawa, Ichihara (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 1077 days.

(21) Appl. No.: 12/527,142

(22) PCT Filed: Feb. 12, 2008

(86) PCT No.: PCT/JP2008/052602
§ 371 (c)(1),
(2), (4) Date: Aug. 13, 2009

(87) PCT Pub. No.: WO2008/099949
PCT Pub. Date: Aug. 21, 2008

(65) Prior Publication Data
US 2010/0019277 A1    Jan. 28, 2010

(30) Foreign Application Priority Data
Feb. 16, 2007    (JP) .................. 2007-036626

(51) Int. Cl.
*H01L 29/06* (2006.01)
*H01L 31/00* (2006.01)
(Continued)

(52) U.S. Cl.
CPC ........ *H01L 29/7783* (2013.01); *H01L 29/207* (2013.01); *H01L 29/66462* (2013.01);
(Continued)

(58) Field of Classification Search
CPC ........... H01L 21/0242; H01L 21/02458; H01L 21/02502; H01L 21/0254; H01L 21/02581;
(Continued)

(56) References Cited

U.S. PATENT DOCUMENTS

| | | | |
|---|---|---|---|
| 5,332,451 A | 7/1994 | Hata et al. | |
| 6,121,634 A * | 9/2000 | Saito ............... | B82Y 20/00 257/101 |

(Continued)

FOREIGN PATENT DOCUMENTS

| | | |
|---|---|---|
| JP | 09-232685 A | 9/1997 |
| JP | 11-162848 A | 6/1999 |

(Continued)

OTHER PUBLICATIONS

Examination Report dated Feb. 24, 2011 issued by British Patent Office, referring to Application No. GB 0915201.8.
(Continued)

*Primary Examiner* — Meiya Li
(74) *Attorney, Agent, or Firm* — Fitch, Even, Tabin & Flannery, LLP

(57) ABSTRACT

The present invention provides an epitaxial substrate for field effect transistor. In the epitaxial substrate for field effect transistor, a nitride-based Group III-V semiconductor epitaxial crystal containing Ga is interposed between the ground layer and the operating layer, and the nitride-based Group III-V semiconductor epitaxial crystal includes the following (i), (ii) and (iii). (i) a first buffer layer containing Ga or Al and containing a high resistivity crystal layer having added thereto compensation impurity element present in the same period as Ga in the periodic table and having small atomic number; (ii) a second buffer layer containing Ga or Al, laminated on the operating layer side of the first
(Continued)

buffer layer; and (iii) a high purity epitaxial crystal layer containing acceptor impurities in a slight amount such that non-addition or depletion state can be maintained, provided between the high resistivity layer and the operating layer.

9 Claims, 6 Drawing Sheets

(51) Int. Cl.
*H01L 29/778* (2006.01)
*H01L 29/207* (2006.01)
*H01L 29/66* (2006.01)
*H01L 21/02* (2006.01)
*H01L 29/20* (2006.01)

(52) U.S. Cl.
CPC ...... *H01L 21/0242* (2013.01); *H01L 21/0254* (2013.01); *H01L 21/0262* (2013.01); *H01L 21/02458* (2013.01); *H01L 21/02502* (2013.01); *H01L 21/02581* (2013.01); *H01L 29/2003* (2013.01)

(58) Field of Classification Search
CPC ............. H01L 21/0262; H01L 29/2003; H01L 29/207; H01L 29/66462; H01L 29/7783
USPC ... 257/11, 76, 189, 192, 194, 213, 613, 615, 257/E33.023, E33.024, E33.028–E33.03, 257/E33.033, E33.034, E21.085, E21.097, 257/E21.1, E21.108, E21.11, E21.117, 257/E21.126, E21.142, E21.152, E21.155; 438/478, 495, 499, 501, 505, 508, 438/FOR. 256, FOR. 264, FOR. 286, 438/FOR. 301, FOR. 302; 117/19, 952
See application file for complete search history.

(56) References Cited

U.S. PATENT DOCUMENTS

| 7,170,095 | B2 | 1/2007 | Vaudo et al. | |
|---|---|---|---|---|
| 7,508,014 | B2 | 3/2009 | Tanimoto | |
| 2003/0211710 | A1* | 11/2003 | Hiramatsu et al. | 438/478 |
| 2005/0023555 | A1 | 2/2005 | Yoshida et al. | |
| 2005/0145874 | A1* | 7/2005 | Saxler | 257/103 |
| 2006/0108602 | A1 | 5/2006 | Tanimoto | |
| 2006/0118824 | A1* | 6/2006 | Otsuka | H01L 29/7787 257/194 |
| 2006/0145761 | A1* | 7/2006 | Pribble et al. | 330/251 |
| 2006/0173582 | A1 | 8/2006 | Motoyama | |
| 2006/0281238 | A1* | 12/2006 | Harris et al. | 438/172 |
| 2007/0096262 | A1* | 5/2007 | Takasone | H01L 21/0237 257/615 |
| 2007/0131968 | A1* | 6/2007 | Morita | H01L 21/28581 257/192 |

FOREIGN PATENT DOCUMENTS

| JP | 2000-068498 A | | 3/2000 |
|---|---|---|---|
| JP | 2004-311913 A | | 11/2004 |
| JP | 2006-173582 A | | 6/2006 |
| JP | 3128178 U | * | 12/2006 |
| WO | 03/071607 A1 | | 8/2003 |
| WO | WO 2005/008738 A2 | | 1/2005 |

OTHER PUBLICATIONS

Office Action dated Dec. 14, 2010, in corresponding Chinese Application 200880004854.X (in Chinese/English translation).
International Search Report dated May 2, 2008.
Webb, J.B., et al.: 'Semi-insulating C-doped GaN and high mobility AlGaN/GaN heterostructures grown by ammonia molecular beam epitaxy', Applied Physics Letters, 1999, pp. 953-955, vol. 75, No. 7, American Institute of Physics.
Van De Walle, Chris G., et al.: 'Theory of doping and defects in III-V nitrides', Journal of Crystal Growth, 1998, pp. 505-510, Elsevier Science B.V.
Katzer, D.S. et al.: 'Molecular beam epitaxy of beryllium-doped GaN buffer layers for AlGaN/GaN HEMTs', Journal of Crystal Growth, 2003, pp. 481-486, Elsevier Science B.V.
Akasaki et al., Group III Nitride Semiconductor, p. 157-159 and p. 291-292 (1999).
Sasajima et al., "High Resistivity Oxygen-Doped AlGaAs For Power Devices," Power Semiconductor Materials and Devices Symposium, 425-430 (1997).
Korean Office Action in Korean Application No. 10-2009-7017689 dated Sep. 5, 2013 with English language translation.
Japanese Office Action dated Feb. 19, 2013, corresponding with Japanese Application 2008-033334 (English translation).
Taiwanese Office Action dated May 6, 2013, corresponding with Taiwanese Application 097104965 (English translation).
Korean Patent Office Action (with translation), dated Dec. 9, 2014 in Korean Patent Application No. 10-2009-7017689.
Korean Office Action issued against Korean Patent Application No. 10-2009-7017689 dated Feb. 25, 2015 with English translation.

* cited by examiner

EPITAXIAL SUBSTRATE FOR FIELD EFFECT TRANSISTOR

CROSS-REFERENCE TO RELATED APPLICATIONS

This is a U.S. National Phase of International Application PCT/JP2008/052602, filed Feb. 12, 2008, and claims the benefit of priority under 35 U.S.C. § 119 based on Japanese Application No. 2007-036626, filed Feb. 16, 2007, the entire disclosures of which applications are hereby incorporated herein by reference.

TECHNICAL FIELD

The present invention relates to an epitaxial substrate for field effect transistor (hereinafter referred to as "FET") using a nitride-based Group III-V semiconductor.

BACKGROUND ART

A field effect transistor using a nitride-based Group III-V semiconductor epitaxial substrate (hereinafter referred to as "GaN-FET") is a field effect transistor constituted such that a GaN layer drives as a channel layer, and it is an element which rapidly becomes widely noticed of late from that the GaN-FET has high voltage resistance, high heat resistance and small environmental load of constituent materials as compared with the conventional FET having a structure that an epitaxial semiconductor crystal layer such as GaAs, AlGaAs, InGaAs, InGaP and AlInGaP is used as a channel layer.

The GaN-FET has various types in view of the structure of an operating layer. In particular, the GaN-FET of the type that a two-dimensional electron gas (hereinafter referred to as "2DEG") induced in the neighborhood of the interface between nitride semiconductor materials having different lattice constant is driven as a channel is called GaN-HEMT where HEMT refers to High Electron Mobility Transistor. The GaN-HEMT has the characteristics of excellent frequency characteristics and high power density, in addition to the above characteristics, and is strongly expected to put into practical use.

The GaN-HEMT is prepared by laminating epitaxial crystals on a ground substrate by, for example, an electron beam epitaxial growth method (hereinafter referred to as "MBE method") or a metalorganic vapor phase growth method (hereinafter referred to as "MOVPE method"), and processing the laminate into the desired device shape by photolithography. The example of structure of the GaN-HEMT can refer to, for example, literature references.

In the case that MOVPE method is used as a lamination method of semiconductor crystals for the production of an epitaxial substrate for GaN-HEMT, an epitaxial substrate having a given layer structure can be obtained by heating a ground substrate such as monocrystal sapphire, monocrystal silicon carbide (hereinafter referred to as "SiC") or monocrystal silicon in a reactor, successively feeding trimethylgallium, trimethylaluminum, ammonia and dopant gas as raw material gases to the reactor, thermally decomposing those gases on the substrate, and successively depositing AlN buffer layer, undoped GaN layer (hereinafter referred to as "ud-GaN"), undoped AlGaN (hereinafter referred to as "ud-AlGaN") and n-type AlGaN (hereinafter referred to as "n-AlGaN") on the substrate.

In the case of the above-illustrated layer structure, 2DEG is formed at the interface between ud-AlGaN layer and ud-GaN layer, and this forms a channel and operates as FET. AlN buffer layer and a lower layer side not containing a channel of ud-GaN layer (hereinafter referred to as "ud-GaN buffer layer") are introduced to relax mismatching at the epitaxial growth between a ground substrate and a channel forming layer due to difference in lattice constant and difference in coefficient of thermal expansion and to form a channel layer having less defect. The ground substrate such as monocrystal sapphire, SiC and monocrystal silicon described above each has large difference in lattice constant and large difference in thermal expansion to GaN crystals. Therefore, in the production of FET using those substrates, the ud-GaN buffer layer is generally grown in large thickness (usually 1 µm or more) such that the ud-GaN buffer layer exhibits sufficient buffer effect. For such a buffer layer, a reference is, for example, GROUP III NITRIDE SEMICONDUCTOR, written and edited by Isamu Akasaki, p 157 (1999), Baifukan.

For the purpose of the general discussion, a layer having a role of AlN buffer layer in GROUP III NITRIDE SEMICONDUCTOR, written and edited by Isamu Akasaki, p. 157 and p. 291 (1999), Baifukan is called a first buffer layer, and a layer having a role of ud-GaN buffer layer is called a second buffer layer, in the following description. It is ideal in the operation of GaN-HEMT that current injected from a source electrode flows into a drain electrode through only a channel part, and it is not preferred that current flows into the first buffer layer or the second buffer layer. If current flowed into the first buffer layer or the second buffer layer, even though a channel is electrically depleted by applying voltage to a gate electrode, current flowing between the source electrode and the drain electrode is not completely shielded. This leads to the problems of deterioration of pinch-off characteristics and increase in drain leakage. Furthermore, the unnecessary current component has low mobility different from 2DEG. As a result, in the case of operating the gate electrode with high frequency voltage, adverse influence such as frequency dispersion is involved. Additionally, the unfavorable unnecessary current also flows into adjacent other elements, causing the interference such as fluctuation of threshold voltage of the adjacent elements.

To avoid the above-described various problems caused in FET, it is effective to insulate the first buffer layer, the second buffer layer or a part thereof, that is, to increase resistance to an extent such that only current capable of ignoring influence as compared with a size of channel current flows. When high resistivity layer is formed in this part, electrons flowing from the source electrode is shielded by the layer, and do not exude in the lower part than the layer. As a result, FET can easily achieve pinch-off. In general, nitride-based Group III-V monocrystal has extremely high stability chemically and physically, and deep element isolation processing as reaching the substrate is extremely difficult. However, in the case of introducing a high resistivity layer as above, interference to the adjacent elements can easily be prevented if only element isolation processing is carried out to only the depth up to the high resistivity layer.

However, it is not easy to epitaxially grow high resistivity nitride Group III-V monocrystal. Nitride Group III-V monocrystal epitaxially grown under the general conditions tends to show high n-type conductivity even though impurities are not intentionally added. The reason is based on the following interpretations. Because the nitride Group III-V monocrystal is grown at relatively high temperature, nitrogen atom having high dissociation pressure is easily withdrawn from crystals, and the voids generate free electrons.

In a gas phase growth method, the nitride Group III-V monocrystal has shallow donor level by the incorporation of oxygen which is impurity easily incorporated from the atmosphere, and free electrons are easily generated, thereby giving 2n-type conductivity. For the cause of the n-type conductivity shown by GaN crystal, a reference is, for example, Chris G. Van de Walle, Catherine Stampfl, J. Crystal Growth 189/190 (1998), 505-510.

There is also the reason due to laminate structure of crystal. That is, the nitride Group III-V monocrystal has large difference in lattice constant to the ground substrate as described above. Various crystal defects are present in crystal. The defect has a level inherent in defect species. Some are easily ionized, thereby imparting conductivity to crystal.

One measure to make the epitaxial crystal semiconductor have high resistivity is a method of introducing charge compensation impurity into crystal. The charge compensation impurity means impurity which forms deep level accepting electron in forbidden band. Electrons flowing into the layer containing the impurity are rapidly captured by the level and restricted. Therefore, a semiconductor layer having a large amount of the impurity doped therein acts as an extremely high resistivity layer. Realization of a high resistivity layer by the measure and the effect in the case of applying to FET are conventionally known. For example, in a gallium arsenide semiconductor, an example of forming a deep acceptor level by doping oxygen in AlGaAs semiconductor crystal epitaxially grown, thereby realizing a high resistivity epitaxial layer is provided by Sasajima Y., Fukuhara N., Hata M., Maeda T., and Okushi H., Power Semiconductor Materials and Devices Symposium, 425-430 (1997). Furthermore, an example of applying the epitaxial layer to a buffer layer of FET, thereby obtaining good pinch-off characteristics is provided by Japanese Patent No. 2560562.

This measure can be expected to be effective even in a gallium nitride-based semiconductor, and various investigations have been already made and reported. For example, D. S. Katzer, D. F. Storm, S. C. Binari, J. A. Roussos and B. V. Shanabrook, J. Crystal Growth 251 (2003) 481-486 reports GaN-HEMT using a buffer layer obtained by doping beryllium (Be) in GaN crystal by MBE method. According to the report, it is reported that GaN layer reduced leakage current in lateral direction in triple digits by doping beryllium, and pinch-off characteristics were remarkably improved in FET using this layer as a buffer layer.

Further, J. B. Webb, H. Tang, S. Rolfe, and J. A. Bardwell, Appl. Phys. Lett., 75 (1999) 953 reports an example that hetero structure of AlGaN/GaN was epitaxially grown on a buffer layer obtained by doping carbon (C) in GaN crystal by MBE. According to this report, it is reported that an extremely high resistivity GaN buffer layer having resistivity of $10^6$ Ωcm was obtained by doping carbon, and AlGaN/GaN hetero structure-induced 2DEG laminated thereon had good characteristics that mobility is 1,200 $cm^2/V/S$.

According to those reports, it is reported that where those impurities are doped in GaN layer and the GaN layer is applied to FET, certain effect can be expected in the improvement of characteristics of FET.

However, the above-described prior arts have the following problems on production. It is known that beryllium has extremely strong toxicity, and load to safety and environment is extremely large. Thus, the application of beryllium to production is not always practical. Carbon has an atomic radius extremely greater than that of gallium atom (hereinafter referred to as "Ga") and nitrogen atom (hereinafter referred to as "N") constituting gallium nitride crystal (Ga: 0.76 angstrom, N: 1.57 angstroms, C: 2.46 angstroms). Where carbon is doped in crystal in high concentration, lattice distance of crystal is disturbed, resulting in deterioration of crystallizability.

In MOVPE method, carbon tetrabromide and carbon tetrachloride are generally used as raw material gas of carbon. Those have bromine and chlorine in the molecule. Therefore, where those are introduced into a reactor, bromine gas or chlorine gas is generated. This gas etches an epitaxial layer, resulting in deterioration of crystallizability. In the growth of GaN crystal, tetramethyl gallium and tetraethyl gallium are generally used as raw material gas of gallium. In the reaction in which those are crystallized as Ga, it is known that those simultaneously release C, and the C is incorporated into an epitaxial layer. The incorporation amount quickly changes by growth rate, growth pressure and the like as parameters of vapor deposition. That is, it is difficult in MOVPE method to control C concentration with good accuracy by only controlling flow rate of a C precursor into a reactor, though the other doping materials is not difficult to be controlled by the flow rate.

Even though the production can be performed by avoiding the above problems on production, where compensation impurities are present in a layer, other disadvantages may be posed in FET characteristics. That is, the compensation impurities capture electrons in the inherent normal state to immobilize. Therefore, when the compensation impurities are dispersed in the vicinity of a channel layer, this affects the running itself of channel electrons related to FET operation. The influence is developed as turbulence of waveform which is unfavorable for FET, such as generation of kink 400 at 1-5 characteristics.

DISCLOSURE OF THE INVENTION

An object of the present invention is to provide an epitaxial substrate for field effect transistor that can solve the problems in the prior art.

As a result of investigations to solve the problems, the present inventors have completed the present invention.

The present invention provides the following (1) to (12).
(1) An epitaxial substrate for field effect transistor, wherein a nitride-based Group III-V semiconductor epitaxial crystal containing Ga is interposed between the ground substrate and the operating layer, and the nitride-based Group III-V semiconductor epitaxial crystal comprises the following (i), (ii) and (iii):

(i) a first buffer layer containing Ga or Al and containing a high resistivity crystal layer having added thereto compensation impurity element that is present in the same period as Ga in the periodic table and has a smaller atomic number than Ga;

(ii) a second buffer layer containing Ga or Al, laminated on the operating layer side of the first buffer layer; and (iii) a high purity epitaxial crystal layer that is in a non-addition state, or contains acceptor impurities in a slight amount such that a depletion state can be maintained, provided between the high resistivity crystal layer and the operating layer.
(2) The substrate described in (1), wherein the compensation impurity contained in the first buffer layer is selected from the group consisting of V, Cr, Mn and Fe.
(3) The substrate described in (2), wherein the compensation impurity contained in the first buffer layer is Mn.

(4) The substrate described in any one of (1) to (3), wherein a concentration of the compensation impurity contained in the first buffer layer is from 1E10 cm$^{-3}$ to 1E20 cm$^{-3}$.

(5) The substrate described in anyone of (1) to (4), wherein the first buffer layer comprises AlN or GaN.

(6) The substrate described in (5), wherein the first buffer layer comprises AlN.

(7) The substrate described in any one of (1) to (6), wherein the second buffer layer comprises Al$_x$Ga$_{1-x}$N (0≤x≤0.2).

(8) The substrate described in any one of (1) to (7), wherein the second buffer layer has a thickness of 5,000 angstroms or more.

(9) The substrate described in any one of (1) to (8), wherein the acceptor impurity contained in the high purity epitaxial crystal layer is selected from the group consisting of Mg, Mn and Zn.

(10) The substrate described in any one of (1) to (9), wherein the high purity epitaxial crystal layer has a thickness of 200 angstroms or more.

(11) The substrate described in any one of (1) to (10), wherein the high purity epitaxial crystal layer has a half-value width of XRD (x-ray diffraction) rocking curve from (0004) face of 3,000 seconds or shorter.

(12) A field effect transistor obtained using the substrate above-described in any one of (1) to (11).

DESCRIPTION OF REFERENCE NUMERALS AND SIGNS

Figure 1:
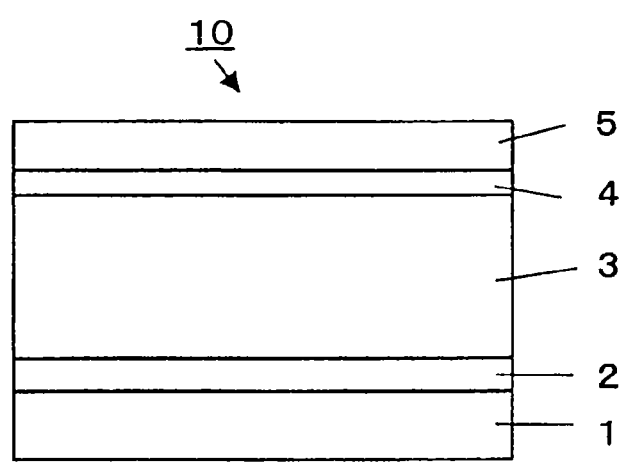
FIG. 1 is a schematic structural view showing an embodiment of the present invention.

1 Ground substrate
2 AlN first buffer layer
3 AlGaN second buffer layer
4 ud-GaN high purity epitaxial crystal layer
5 ud-AlGaN layer
10 Epitaxial substrate for FET
100, 101, 106 Mass flow controllers
102 Temperature-controlled bath
103 Container
104, 118 High pressure gas bombs
105, 119 Pressure reducing valves
107 Reactor
108 Resistive heater
110 Substrate holder
112 Exhaust port
301 Source electrode
302 Gate electrode
303 Drain electrode
304 Element isolation groove
400 Kink

BEST MODE FOR CARRYING OUT THE INVENTION

Epitaxial Substrate for FET

The present invention is described by reference to the drawings. FIG. 1 is a schematic layer structure view for describing an epitaxial substrate for GaN-HEMT as the embodiment of the present invention.

An epitaxial substrate 10 for FET has a layer structure, wherein a nitride-based Group III-V semiconductor epitaxial crystal containing Ga is formed on a ground substrate 1, and an operating layer is formed on the epitaxial crystal. Specifically, the epitaxial substrate comprises the ground substrate 1 having laminated thereon an Mn-doped AlN first buffer layer 2, an Mn-doped AlGaN second buffer layer 3, and an ud-GaN high purity epitaxial crystal layer 4, in this order. The nitride-based Group III-V semiconductor epitaxial crystal containing Ga comprises the AlN first buffer layer 2, the second buffer layer 3 and the high purity epitaxial crystal layer 4. Further, an ud-AlGaN layer 5 is laminated as an operating layer on the high purity epitaxial crystal layer 4. Each layer is described below.

Ground Substrate

The ground substrate comprises, for example, sapphire monocrystal, SiC or silicon monocrystal. The ground substrate is generally semi-insulating or conductive, and is preferably semi-insulating. Substrates having less defects, necessary for crystal growth are commercially available, and those commercially available products are used as the ground substrate.

First Buffer Layer

The first buffer layer contains Ga or Al, preferably AlN or GaN, and more preferably AlN. The first buffer layer contains a high resistivity crystal layer.

In FIG. 1, Mn is doped in the AlN first buffer layer 2. This converts the AlN first buffer layer 2 into a high resistivity crystal layer. Mn is one example of compensation impurity elements doped to convert a buffer layer into a high resistivity crystal layer. The compensation impurity element is not limited to Mn. The compensation impurity element may be an element present in the same period as Ga in the periodic table and having a smaller atomic number. For example, V, Cr and Fe may be used in place of Mn. Doping concentration of the compensation impurity is generally 1E10 cm$^{-3}$ or more, preferably 1E13 cm$^{-3}$ or more, and more preferably 1E15 cm$^{-3}$ or more, and is generally 5E20 cm$^{-3}$ or less, preferably from 1E20 cm$^{-3}$ or less, and more preferably from 1E19 cm$^{-3}$ or less. In the present embodiment, Mn is doped in both the AlN first buffer layer 2 and the AlGaN second buffer layer 3, thereby converting both layers into a high resistivity crystal layer. However, only the AlN first buffer layer 2 may be converted into a high resistivity crystal layer.

The first buffer layer has a thickness of generally from 50 to 2,000 angstroms. From the standpoint of the balance between productivity and effect, the thickness is preferably 100 angstroms or more, and more preferably 200 angstroms or more, and is preferably 1,000 angstroms or less.

Thus, the conversion of the AlN first buffer layer 2 into a high resistivity crystal layer can effectively prevent current for FET operation from flowing into layers other than an operating layer.

Second Buffer Layer

The second buffer layer contains Ga or Al, and preferably $Al_xGa_{1-x}N$, wherein x generally satisfies the condition $0 \leq x \leq 0.2$, preferably $0 \leq x \leq 0.1$, and more preferably $0 \leq x \leq 0.2$.

In FIG. 1, Mn is doped in the AlGaN second buffer layer 3 in the same way of the AlN first buffer layer 2. This converts the AlGaN second buffer layer into a high resistivity crystal layer. The compensation impurity element of the second buffer layer is an element present in the same period as Ga in the periodic table and having a smaller atomic number. For example, the element is V, Cr, Mn or Fe, and preferably Mn. Doping concentration of the compensation impurity is generally 1E10 $cm^{-3}$ or more, preferably from 1E13 $cm^{-3}$ or more, and more preferably from 1E15 $cm^{-3}$ or more, and is generally 5E20 $cm^{-3}$ or less, preferably from 1E20 $cm^{-3}$ or less, and more preferably from 1E19 $cm^{-3}$ or less. The AlGaN second buffer layer 3 has a thickness of preferably 5,000 angstroms or more, more preferably more than 10,000 angstroms, and most preferably 15,000 angstroms or more, and is generally 50,000 angstroms or less.

As in the present embodiment, the conversion of the AlN first buffer layer 2 and the AlGaN second buffer layer 3 into high resistivity crystal layers can effectively prevent current for FET operation from flowing into layers other than an operating layer.

High Purity Epitaxial Crystal Layer

The high purity epitaxial crystal layer is provided between the high resistivity crystal layer and the operating layer. The high purity epitaxial crystal layer is in a non-addition state, or contains acceptor impurities in a slight amount such that a depletion state can be maintained.

In FIG. 1, the ud-GaN high purity epitaxial crystal layer 4 satisfying the above is provided so as to allow 2DEG generated in the ud-AlGaN layer 5 to smoothly flow between source and drain.

The high purity epitaxial crystal layer has a thickness of preferably 200 angstroms or more, more preferably 500 angstroms or more, and most preferably 2,000 angstroms or more, and is generally 30,000 angstroms or less.

The high purity epitaxial crystal layer has half-value width of XRD rocking curve from (0004) face of generally 3,000 seconds or shorter.

Operating Layer

The operating layer contains, for example, ud-AlGaN. The thickness of the operating layer is set so as to obtain the desired pinch-off voltage depth and gm characteristics. Where the thickness is too large, influence of lattice mismatching to the high purity epitaxial crystal layer is increased, resulting in deterioration of crystal. Where the thickness is too small, gate voltage resistance is deteriorated. Therefore, the thickness is preferably 50 angstroms or more, more preferably 100 angstroms or more, and further preferably 200 angstroms or more, and is preferably 800 angstroms or less, more preferably 600 angstroms or less, and further preferably 400 angstroms or less.

Production Method of Epitaxial Substrate

The epitaxial substrate for FET of the present invention is produced by a method of laminating epitaxial crystals using, for example, MOVPE method, MBE method or hydride vapor phase growth method.

Figure 2:
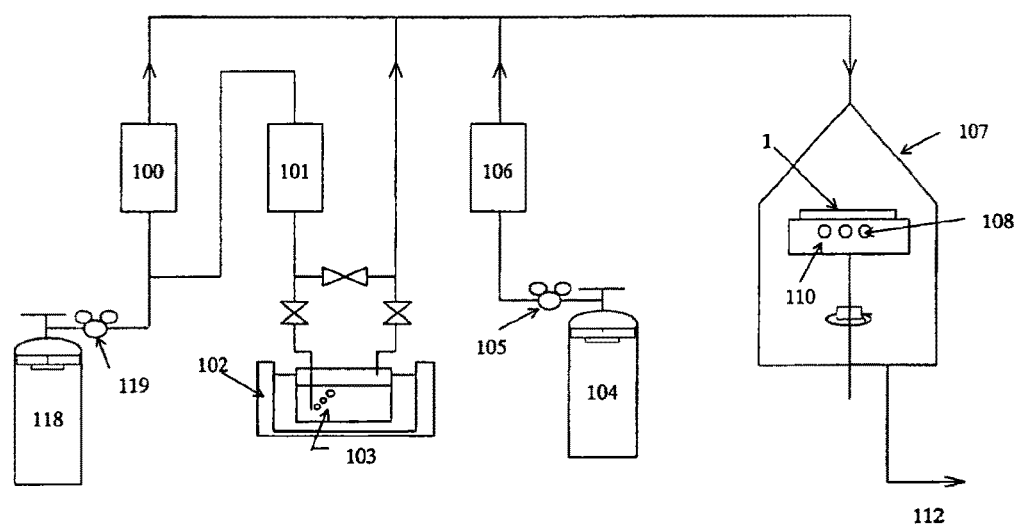
FIG. 2 is a schematic view of an MOVPE growth apparatus.

FIG. 2 is a schematic view of an MOVPE growth apparatus. In the apparatus of FIG. 2, a carrier gas in a high pressure bomb 118 is passed through a pressure reducing valve 119, flow rate-controlled by a mass flow controller (MFC) 101, introduced into a container 103 controlled to the desired temperature in a temperature-controlled bath 102, and bubbled in Group III raw material in the container 103. By bubbling, space of the container 103 is filled with the Group III raw material of vapor pressure determined by the temperature of the temperature-controlled bath 102, and the Group III raw material gas in an amount on the basis of the vapor pressure and the carrier gas flow rate is introduced into a reactor 107.

The flow rate of the Group III raw material thus controlled is generally in a range of from 10E-3 to 10E-5 mol/min. Examples of the Group III raw material include alkylgallium such as trimethylgallium (TMG) and triethylgallium (TEG); and alkylaluminum such as trimethylaluminum (TMA) and triethylaluminum (TEA). Those are used alone or as mixtures so as to achieve the desired composition. Commercially available products for MOVPE are used as the raw material.

Group V raw material is charged in a high pressure gas bomb 104, pressure-reduced by a pressure reducing valve 105, flow rate-controlled by MFC 106, and introduced into the reactor 107. The amount of the Group V raw material introduced is generally from 50 to 400 times the amount of the Group III raw material gas. The Group V raw material is, for example, ammonia. Ammonia having high purity necessary for crystal growth is commercially available, and is used as the ammonia.

The carrier gas filled in the high pressure gas bomb 118 is pressure-reduced by the pressure reducing valve 119, flow rate-controlled by MFC 100, and introduced into the reactor 107. The flow rate of the carrier gas is generally in a range of from 10 SLM to 200 SLM.

A substrate holder 110 made of graphite, holding the ground substrate 1, is arranged in the reactor 107. The substrate holder 110 has a rotation mechanism. A resistive heater (not shown) is closely contacted with the back of the substrate holder, and the ground substrate 1 can be heated from the back through the substrate holder 110. In the case of growth of the AlN buffer layer, the heating is conducted such that the surface temperature of the ground substrate 1 is generally from about 650° C. to about 800° C. In the case of growth of the GaN buffer layer lower part, the GaN channel layer and an AlGaN Schottky layer, the heating is conducted such that the surface temperature of the ground substrate 1 is generally from about 950° C. to about 1,150° C. The raw material gas vapor introduced into the reactor 107 is thermally decomposed in the vicinity of the surface of the ground substrate 1, and grown as crystals on the ground substrate 1. Residual gas and undecomposed gas are discharged from an exhaust port 112. Introduction of various raw material gases into the reactor 107 can grow GaN crystals, AlGaN crystals and AlN crystals, in which compensation impurities and Si are doped/undoped.

Raw material of the compensation impurities is a manganese compound such as biscyclopentadienyl manganese (EtCp2Mn). High purity raw materials necessary for crystal growth are commercially available, and can be used as the raw material. The raw material of the compensation impurities is introduced into the reactor 107 in the same manner as in the Group III raw material.

Silicon raw material is, for example, disilane and monosilane. High purity raw materials necessary for crystal growth are commercially available, and can be used as the raw material. The silicon raw material is introduced into the reactor 107 in the same manner as in the Group V raw material.

The carrier gas is, for example, hydrogen gas and nitrogen gas. Those are used alone or as mixtures thereof. High purity hydrogen gas and nitrogen gas necessary for crystal growth are commercially available, and can be used as the carrier gas.

Production examples of GaN-HEMT having the layer structure shown in FIG. 1, having Mn-doped nitride crystals for FET grown by MOVPE method is described below by reference to FIG. 2.

Mn-doped AlN first buffer layer 2 is grown in a given thickness on the cleaned ground substrate 1. The temperature of the ground substrate 1 is changed to a given temperature, Group III raw material gas is changed, and Mn-doped AlGaN second buffer layer 3 is grown in a given thickness. The ground substrate 1 can use a sapphire monocrystal substrate, an SiC substrate and a silicon monocrystal substrate. Those substrates are preferably semi-insulating, but conductive substrate can be used. Substrates having less defect necessary for crystal growth are commercially available, and can be used as the substrate. Introduction of manganese raw material gas is stopped, and ud-GaN high purity epitaxial crystal layer 4 is grown in a given thickness. Raw material gas is changed, and ud-AlGaN layer 5 is grown in a given thickness. Thus, epitaxial substrate 10 for FET having the structure shown in FIG. 1 is obtained.

The AlN first buffer layer 2 has a thickness of generally from 50 to 2,000 angstroms. From the standpoint of balance between productivity and effect, the thickness is preferably from 100 to 2,000 angstroms, and more preferably from 200 to 1,000 angstroms. A GaN buffer layer having the same thickness may be used in place of the AlN first buffer layer 2. In this case, the GaN buffer layer is grown in the same manner as in the AlN second buffer layer 2 except that the raw material gas is changed so as to have the desired composition.

The thickness of the AlGaN second buffer layer 3 is determined such that the AlGaN second buffer layer 3 has sufficiently high resistance, and additionally, good crystallizability is given to the ud-GaN high purity epitaxial crystal layer 4. Judgment of crystallizability can be performed by rocking curve measurement with XRD. For example, (0002) face can be used as a crystal face to be measured. Where the face is measured, a guide that good characteristics are obtained is that a half-value width of a peak is 300 seconds or shorter. The thickness of the AlGaN second buffer layer 3 greatly depends on growth conditions, and is preferably 5,000 angstroms or more, more preferably 10,000 angstroms or more, and most preferably 15,000 angstroms or more. The upper limit of the thickness is preferably 50,000 angstroms or less.

Where the thickness of the ud-GaN high purity epitaxial crystal layer 4 is small, deep level formed by the compensation impurities in the AlGaN second buffer layer 3 gives influence to 2DEG, causing kink or the like in the current-voltage characteristics. Therefore, large thickness is preferred. The thickness is preferably 200 angstroms or more, more preferably 500 angstroms or more, and most preferably 2,000 angstroms or more. The upper limit of the thickness is 30,000 angstroms or less.

The thickness of the ud-AlGaN layer 5 is determined so as to obtain the desired pinch-off voltage depth and gm characteristics. Where the thickness is too large, influence of lattice mismatching to the ud-GaN high purity epitaxial crystal layer 4 is increased, resulting in deterioration of crystals. Where the thickness is too small, gate voltage resistance may be deteriorated. Therefore, the thickness is preferably from 50 to 800 angstroms, more preferably from 100 to 600 angstroms, and further preferably from 200 to 400 angstroms.

The ud-GaN high purity epitaxial crystal layer 4 has n-type conductivity even though non-doped GaN crystal layer, as described before. The ud-AlGaN layer 5 is the same, and electrons of this layer are fed to a channel, thereby forming 2DEG. Therefore, an n-AlGaN layer doped with silicon or the like and grown may be used in place of the ud-AlGaN layer 5 for the purpose of adjusting electron concentration of the channel. However, in the case of using the n-AlGaN layer, there is a possibility that mobility of 2DEG is decreased by scattering of impurities. To avoid this, a laminate structure of ud-AlGaN/n-AlGaN may be formed. In this case, the overall thickness of the ud-AlGaN layer and the n-AlGaN layer is set to be fallen within the above-described range of the thickness.

Al composition x of the $Al_xGa_{1-x}N$ second buffer layer 3 is selected in the range that does not deteriorate crystallizability of the un-GaN high purity epitaxial crystal layer 4. The x is generally $0 \leq x \leq 0.2$, preferably $0 \leq x \leq 0.1$, and more preferably $0 \leq x \leq 0.05$.

Al compositional ratio of the ud-AlGaN layer 5 is determined by its thickness, the desired 2DEG concentration, gate voltage resistance and the like. That is, where the compositional ratio is increased, many 2DEG are theoretically generated. As a result, transistor can be operated with large current, and gate voltage resistance is improved. On the other hand, difference in lattice constant to the ud-GaN high purity epitaxial crystal layer 4 is increased. As a result, particularly in the case that a layer thickness is large, crystal defect is easily generated, and this may rather lead to deterioration of gate voltage resistance. For this reason, the compositional ratio is set in a range of preferably from 10% to 40%, more preferably from 15% to 35%, and further preferably from 20% to 30%.

The doping concentration of each compensation impurity in the AlN first buffer layer 2 and the AlGaN second buffer layer 3 is increased where the desired resistance value and the naturally doped background n-type impurity concentration of AlN crystals, that is, naturally doped n-type impurity concentration, are high, and the thickness of a designed layer is small. On the other hand, where the concentration of the naturally doped n-type impurity is low and a layer is designed to have large thickness, the doping concentration may be low. From those points, solid solubility limit of the compensation impurities in the GaN epitaxial crystals and the concern of deterioration of crystallizability in the case of extremely high concentration, doping concentration of the compensation impurity is preferably from 1E10 to 5E20 $cm^{-3}$, more preferably from 1E13 to 1E20 $cm^{-3}$, and further preferably from 1E15 to 1E19 $cm^{-3}$.

The doping concentration of the acceptor of the ud-GaN high purity epitaxial crystal layer 4 has the lower limit that the layer can be depleted. Where the doping concentration is too high, excess acceptors capture electrons of the channel, causing generation of kink or the like. The concentration depends on the background concentration of the ud-GaN high purity epitaxial crystal layer 4. When the background concentration is high, the doping concentration is increased. Where the background concentration is low and the ud-GaN high purity epitaxial crystal layer 4 is depleted even though the acceptor is not doped, the doping may not be conducted. The doping concentration is generally determined in a range of from 0 $cm^{-3}$ to 1E17 $cm^{-3}$.

The present invention is described above by reference to the embodiment of GaN-HEMT. However, epitaxial substrates for MODFET, MESFET and MISFET, having other FET structure can be produced by changing the structure upper than the ud-GaN high purity epitaxial crystal layer 4.

When the epitaxial substrate 10 for FET has the layer structure as above, a nitride-based epitaxial growth semiconductor crystal for FET, having good pinch-off characteristics, good isolation property between elements and good frequency dispersibility can be provided. Furthermore, the semiconductor crystal having excellent characteristics as above can be produced with high safety and high concentration stability. Thus, the industrial significance is extremely great.

EXAMPLES

The present invention is described in more detail by the Examples, but the invention is not limited by the Examples.

Example 1

Using the apparatus shown in FIG. 2, an epitaxial substrate for FET having the layer structure shown in FIG. 1 was prepared as follows. A sapphire monocrystal substrate was heated to 600° C., hydrogen as a carrier gas was allowed to flow in an amount of 60 SLM, ammonia was allowed to flow in an amount of 40 SLM, TMA was allowed to flow in an amount of 40 sccm from a container in a temperature-controlled bath set to a temperature of 30° C., and biscyclopentadienyl was allowed to flow from a container in a temperature-controlled bath set to a temperature of 30° C. (0 sccm in sample (a), 200 sccm in sample (b) and 1,000 sccm in sample (c)). Thus, AlN first buffer layer was grown to a thickness of 500 angstroms. Growth rate in this case was 470 angstroms/min.

The substrate temperature was increased to 1,040° C., and the flow rate of TMA was changed to 0 sccm. Then, TMG was allowed to flow in an amount of 40 sccm from a container in a temperature-controlled bath set to a temperature of 30° C., and biscyclopentadienyl was allowed to flow from a container in a temperature-controlled bath set to a temperature of 30° C. (0 sccm in sample (a), 200 sccm in sample (b) and 1,000 sccm in sample (c)). Thus, AlGaN second buffer layer was laminated to a thickness of 30,000 angstroms. Growth rate in this case was 470 angstroms/min. The substrate was cooled to room temperature, and taken out of the reactor.

Mn concentration in the second buffer layer of the epitaxial substrate for FET of the sample (c) was obtained by SIMS analysis. As a result, the concentration was 2E19 $cm^{-3}$. Sheet resistance of the epitaxial substrate for FET of the samples (a), (b) and (c) was measured. As a result, sheet resistance of the sample (a) was 434Ω/□, sheet resistance of the sample (b) was 8,000Ω/□, and sheet resistance of the sample (c) was 4,681Ω/□. It was understood from this fact that Mn is incorporated into crystals, deep level formed effectively compensates and decreases naturally doped n-type carrier, and epitaxial semiconductor crystals having extremely high resistivity can be formed.

Example 2

Figure 3:
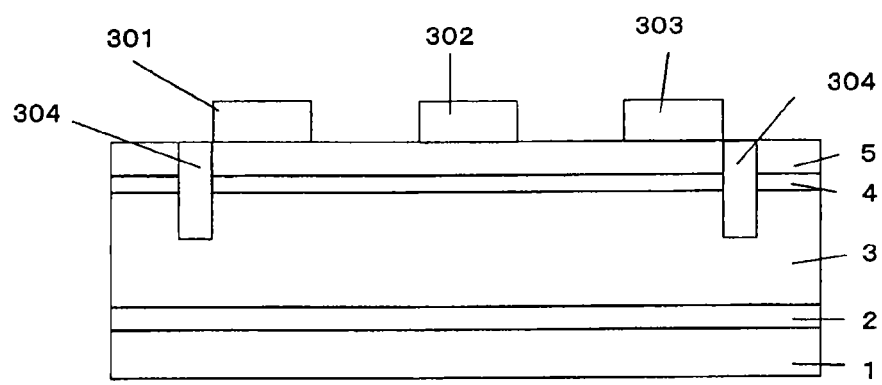
FIG. 3 is a schematic structure of GaN-HEMT obtained in Example 2.

Using the apparatus shown FIG. 2, GaN-HEMT having the layer structure shown in FIG. 3 was prepared. In FIG. 3, the parts corresponding to the respective parts in FIG. 1 are indicated by the same reference numerals. A sapphire monocrystal substrate as the ground substrate 1 was heated to 600° C., hydrogen as a carrier gas was allowed to flow in an amount of 60 SLM, ammonia was allowed to flow in an amount of 40 SLM, TMA was allowed to flow in an amount of 40 sccm from a container in a temperature-controlled bath set to a temperature of 30° C., and biscyclopentadienyl was allowed to flow from a container in a temperature-controlled bath set to a temperature of 30° C. (0 sccm in sample (d), and 1,000 sccm in samples (e) and (f)) Thus, AlN first buffer layer 2 was grown to a thickness of 500 angstroms. Growth rate in this case was 470 angstroms/min.

The substrate temperature was increased to 1,040° C., and the flow rate of TMA was changed to 0 sccm. TMG was allowed to flow in an amount of 40 sccm from a container in a temperature-controlled bath set to a temperature of 30° C., and biscyclopentadienyl was allowed to flow from a container in a temperature-controlled bath set to a temperature of 30° C. (0 sccm in sample (d), and 1,000 sccm in samples (e) and (f)). Thus, GaN second buffer layer was laminated to a thickness of 1,050 angstroms.

The flow rate of biscyclopentadienyl was changed to 0 sccm, and ud-GaN high purity epitaxial crystal layer 4 as a high purity epitaxial crystal layer was grown (100 angstroms in sample (e), and 1,000 angstroms in samples (d) and (f)).

The flow rate of TMG was changed to 100 sccm, and TMA was allowed to flow in an amount of 33 sccm from a container in a temperature-controlled bath set to a temperature of 30° C. Thus, ud-AlGaN layer having Al composition of 0.25 was grown to a thickness of 250 angstroms. Growth rate in this case was 480 angstroms/min.

The substrate was cooled to room temperature, and taken out of the reactor. A resist pattern was formed on the sample obtained by photolithography method, and an element isolation groove 304 was formed to a depth of 2,000 angstroms by ECR plasma dry etching using chlorine gas. The conditions of dry etching were chlorine pressure: 1.5E-2 Pa, plasma current: 400 µW, and voltage applied: 80V. Etching rate in this case was 90 angstroms/min.

Similarly, resist opening was formed in source electrode and drain electrode shapes by photolithography method, and Ti/Al/Ni/Au metal film was laminated to a thickness of 200 angstroms/1,500 angstroms/250 angstroms/500 angstroms by vapor deposition method. Then, the sample was dipped in acetone to achieve lift-off of the resist and the metal film, and subjected to RTA treatment in nitrogen atmosphere at 800° C. for 30 seconds. Thus, a source electrode 301 and a drain electrode 303 were formed.

In the same way, an opening having a gate electrode shape was formed by photolithography method, and the opening was subjected to ashing treatment by oxygen plasma. The ashing conditions were as follows: 130 Pa of oxygen pressure, 100 W of plasma power, and 1 minute of ashing time. Ni/Au metal film was formed to a thickness of 200 angstroms/1,000 angstroms by vapor deposition method, and lift-off was achieved in the same manner as in the source electrode. Thus, a gate electrode 302 was formed. A pad electrode was formed in the same manner as in the gate electrode.

Thus, GaN-HEMT having the structure shown in FIG. 3 wherein a gate length is 2 µm and a gate width is 30 µm was prepared.

Figure 4:
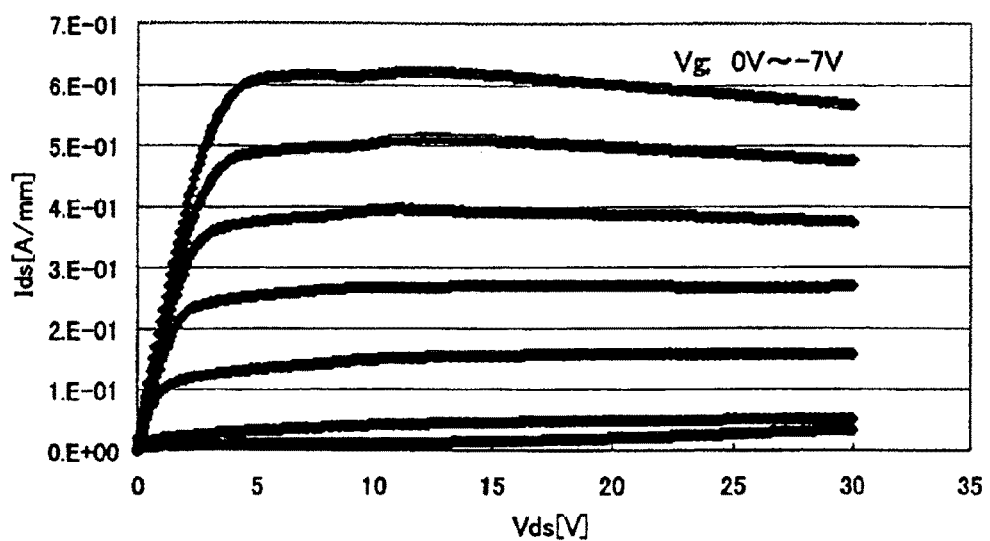
FIG. 4 is a graph showing current-voltage characteristics of GaN-HEMT sample (d) obtained in Example 2 at the application of DC voltage.
Figure 5:
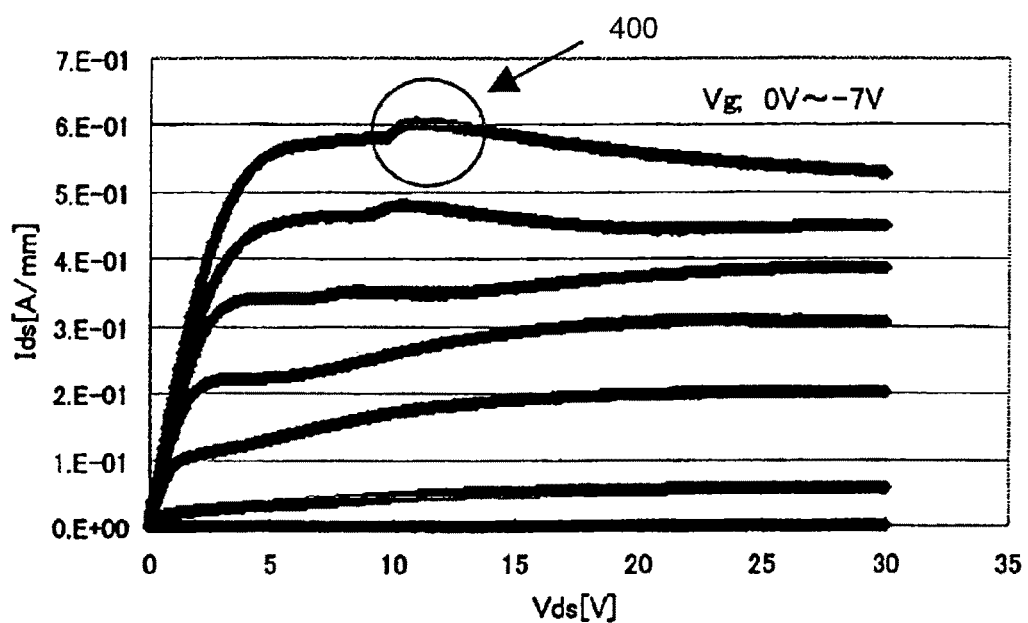
FIG. 5 is a graph showing current-voltage characteristics of GaN-HEMT sample (e) obtained in Example 2 at the application of DC voltage.
Figure 6:
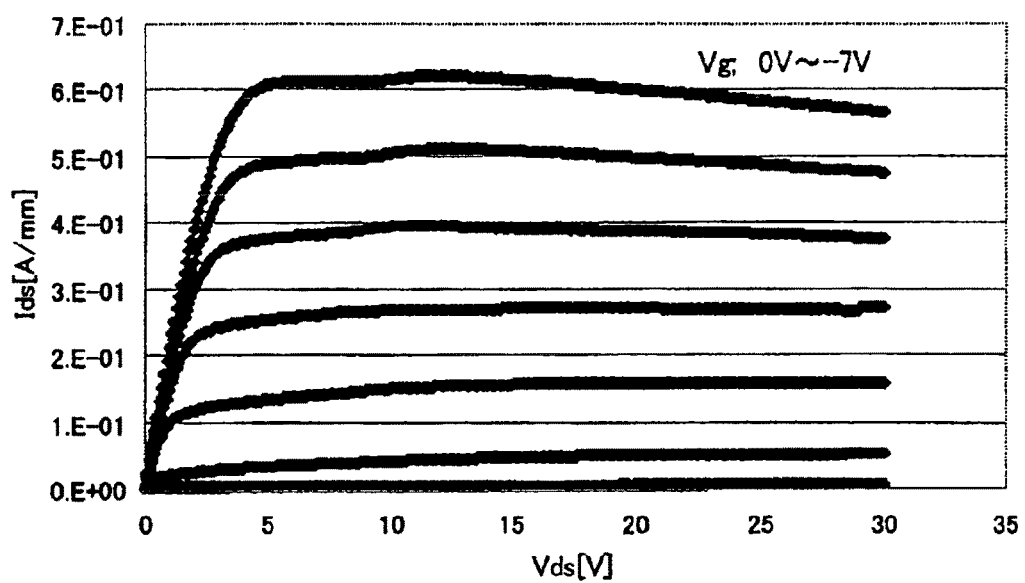
FIG. 6 is a graph showing current-voltage characteristics of GaN-HEMT sample (f) obtained in Example 2 at the application of DC voltage.

Current-voltage characteristics of GaN-HEMT at the application of DC voltage were measured. The results of the samples (d), (e) and (f) are shown in FIGS. 4, 5 and 6, respectively. In the samples (e) and (f) wherein Mn is doped in the GaN layer, drain current is zero (that is, pinch-off) when −7V of gate voltage was applied. On the other hand, in the sample (d) without doping, the drain current is not zero. Thus, pinch-off was not achieved. In the comparison between the Mn-doped sample (e) and the Mn-doped sample (f), kink was generated in a current-voltage curve in the sample (e) having a thin high purity epitaxial crystal layer.

INDUSTRIAL APPLICABILITY

The epitaxial substrate for field effect transistor of the present invention is preferably used in the production of FET having good characteristics. Use of the epitaxial substrate for field effect transistor can produce FET safely with good controllability of concentration.

The invention claimed is:

1. An epitaxial substrate for a field effect transistor, said epitaxial substrate comprising:
   a ground layer;
   a first buffer layer that (i) is disposed directly and physically above the ground layer, (ii) has a thickness from 50 angstroms to 2000 angstroms, and (iii) contains only AlN doped with Mn as a compensation impurity element at a first concentration from $1E10$ $cm^{-3}$ to $1E20$ $cm^{-3}$;
   a second buffer layer that (i) is disposed directly and physically above the first buffer layer, (ii) has a thickness of 5,000 angstroms or more, and (iii) contains only AlGaN doped with Mn at a second concentration from $1E15$ $cm^{-3}$ to $5E20$ $cm^{-3}$;
   an epitaxial crystal layer that (i) is disposed directly and physically above the second buffer layer and (ii) is an undoped epitaxial crystal layer containing only GaN; and
   an operating layer that is disposed above the epitaxial crystal layer and comprises undoped AlGaN.

2. The substrate of claim 1, wherein the thickness of the second buffer layer is 10,000 angstroms or more.

3. The substrate of claim 1, wherein the epitaxial crystal layer has a thickness of 200 angstroms or more.

4. The substrate of claim 1, wherein the second buffer layer comprises $Al_xGa_{1-x}N$ ($0 < x \leq 0.2$).

5. A field effect transistor, said field effect transistor comprising:
   an epitaxial substrate including:
      a ground layer;
      a first buffer layer that (i) is disposed directly and physically above the ground layer, (ii) has a thickness from 50 angstroms to 2000 angstroms, and (iii) contains only AlN doped with Mn as a compensation impurity element at a first concentration from $1E10$ $cm^{-3}$ to $1E20$ $cm^{-3}$, and (iv) does not contain AlGaN;
      a second buffer layer that (i) is disposed directly and physically above the first buffer layer, (ii) has a thickness of 5,000 angstroms or more, and (iii) contains AlGaN doped with Mn at a second concentration from $1E15$ $cm^{-3}$ to $5E20$ $cm^{-3}$;
      an epitaxial crystal layer that is disposed directly and physically above the second buffer layer, and (ii) is an undoped epitaxial crystal layer containing only GaN; and
      an operating layer that is disposed above the epitaxial crystal layer and comprises undoped AlGaN.

6. The substrate of claim 1, wherein the operating layer has a thickness from 100 angstroms to 800 angstroms.

7. The substrate of claim 1, wherein an Al compositional ratio in the undoped AlGaN of the operating layer is from 15% to 35%.

8. The field effect transistor of claim 5, wherein the operating layer has a thickness from 100 angstroms to 800 angstroms.

9. The field effect transistor of claim 5, wherein an Al compositional ratio in the undoped AlGaN of the operating layer is from 15% to 35%.

* * * * *